(12) United States Patent
Mardi

(10) Patent No.: US 7,888,954 B1
(45) Date of Patent: Feb. 15, 2011

(54) METHOD OF UTILIZING AN INTERPOSER IN AN AUTOMATED TEST SYSTEM AND AN AUTOMATED TEST SYSTEM HAVING AN INTERPOSER

(75) Inventor: Mohsen H. Mardi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 149 days.

(21) Appl. No.: 12/233,015

(22) Filed: Sep. 18, 2008

(51) Int. Cl.
*G01R 31/00* (2006.01)
(52) U.S. Cl. .............................. 324/750.19; 324/750.02
(58) Field of Classification Search ........................ None
See application file for complete search history.

(56) References Cited

U.S. PATENT DOCUMENTS

| | | | |
|---|---|---|---|
| 5,791,914 A | 8/1998 | Loranger et al. | |
| 6,181,149 B1 * | 1/2001 | Godfrey et al. | 324/761 |
| 6,503,089 B2 | 1/2003 | Saijo et al. | |
| 6,541,991 B1 * | 4/2003 | Hornchek et al. | 324/755 |
| 6,902,410 B2 | 6/2005 | Watanabe | |
| 7,199,599 B2 | 4/2007 | Batara et al. | |
| 7,202,679 B2 | 4/2007 | Maruyama et al. | |

OTHER PUBLICATIONS

U.S. Appl. No. 12/008,847, filed Jan. 14, 2008, Mahoney et al.

* cited by examiner

*Primary Examiner*—Vinh P Nguyen
(74) *Attorney, Agent, or Firm*—Michael T. Wallace; John J. King

(57) ABSTRACT

A method and apparatus is provided to facilitate testing of integrated circuits using an interposer to be utilized in conjunction with an automated test equipment (ATE) system that includes a device handler and a device tester. The interposer may be utilized to convert overall device under test (DUT) board pitches to accommodate various device handler pitch orientations, or conversely, the interposer may be utilized in conjunction with a single DUT board to convert the footprint of the DUT board to accommodate multiple device package footprints. The interposer may also be used to convert a DUT board exhibiting a first single/multi-site orientation to a converted DUT board that exhibits a second single/multi-site orientation. The interposer may be composed of an elastomeric material having multiple conductive columns distributed throughout the elastomeric material or may be composed of a more rigid material such as a Pogo® pin array or printed circuit board.

20 Claims, 5 Drawing Sheets

METHOD OF UTILIZING AN INTERPOSER IN AN AUTOMATED TEST SYSTEM AND AN AUTOMATED TEST SYSTEM HAVING AN INTERPOSER

FIELD OF THE INVENTION

The present invention generally relates to the testing of integrated circuits, and more particularly to an interposer that facilitates automated testing using incompatible test components.

BACKGROUND OF THE INVENTION

The advent of the integrated circuit has spawned the necessity for automated testing to achieve rapid, accurate, and high volume results. Accordingly, automated test equipment (ATE) has been developed to maximize integrated circuit test efficiency, while minimizing the amount of human intervention that is required to complete a particular set of test scenarios.

Typical ATEs include a so-called "device handler" for maneuvering each integrated circuit, or device under test (DUT), into position to allow a device tester to exercise the DUT using automated test sequences. More advanced ATEs provide the ability to implement test scenarios in parallel, whereby multiple DUTs may be exercised simultaneously. As such, multi-site motherboards have been developed to facilitate the placement of multiple DUTs on a single motherboard. The corresponding device testers employ a first set of test probes that are used to inject stimuli into the one or more input pins of each DUT, while a second set of test probes are used to measure each DUT's response to the test stimuli.

Device testers and device handlers, however, are generally allocated separately and are selected by the IC developer based upon the devices that are to be tested, which may vary widely in terms of package type, pin arrangement, and pin type. As such, a particular device tester/device handler pair may only be able to execute test scenarios on a very specific set of devices. Furthermore, compatibility between the device tester and device handler is further reduced when the DUTs are populated onto multi-site motherboards.

Such compatibility issues often force the IC developer to maintain an inventory of device tester/device handler pairs so as to accommodate the number of device types being tested by the IC developer. In addition, an inventory of DUT motherboards must also be maintained so as to accommodate compatibility between the inventory of device tester/device handler pairs. As such, a direct correlation exists between the costs imposed upon the IC developer and the number of device types that the IC developer wishes to test, since costs are increased in proportion to the number of device types that are to be tested.

Efforts continue, therefore, to develop interposers that reduce the costs imposed upon IC developers by reducing the number of device handler/device tester pairs and the number of DUT motherboards that must be maintained in inventory to accommodate the various IC device types that are to be tested.

SUMMARY OF THE INVENTION

To overcome limitations in the prior art, and to overcome other limitations that will become apparent upon reading and understanding the present specification, various embodiments of the present invention disclose a method and apparatus for an interposer for use with automated test equipment. The interposer is utilized to convert overall device under test (DUT) board pitches to accommodate device handler pitch orientation. Conversely, the interposer may be utilized in conjunction with a single motherboard to convert the footprint of the motherboard so as to accommodate a plurality of device package footprints and single/multi-site arrangements.

In accordance with one embodiment of the invention, a method of utilizing an interposer in an automated test system comprises determining whether characteristics of a device under test board are to be converted to match characteristics of a device handler of the automated test system, engaging the interposer between the device under test board and an interface to the device handler in response to an affirmative determination, utilizing a first surface of the interposer to match the characteristics of the device handler, and utilizing a second surface of the interposer to match characteristics of the device under test board. The conductive columns and corresponding conductive pads of the interposer adapt the device under test board for use with the device handler within the automated test system.

In accordance with another embodiment of the invention, a method of utilizing an interposer in an automated test system comprises determining whether characteristics of a device under test board are to be converted to match characteristics of devices under test, engaging the interposer to the device under test board in response to an affirmative determination, utilizing a first surface of the interposer to match the characteristics of the device under test board, and utilizing a second surface of the interposer to match characteristics of the devices under test. The conductive columns and corresponding conductive pads of the interposer adapt the device under test board for use with the devices under test.

In accordance with another embodiment of the invention, an automated test system comprises a device tester that is adapted to automatically characterize electrical characteristics of devices under test and a device handler that is adapted to present the devices under test to the device tester for automatic characterization. The device handler includes an interface adapted to accept a device under test board. The automated test system further comprises an interposer that is coupled to the interface of the device handler, the interposer being adapted to convert characteristics of the device under test board to be compatible with characteristics of the device handler.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
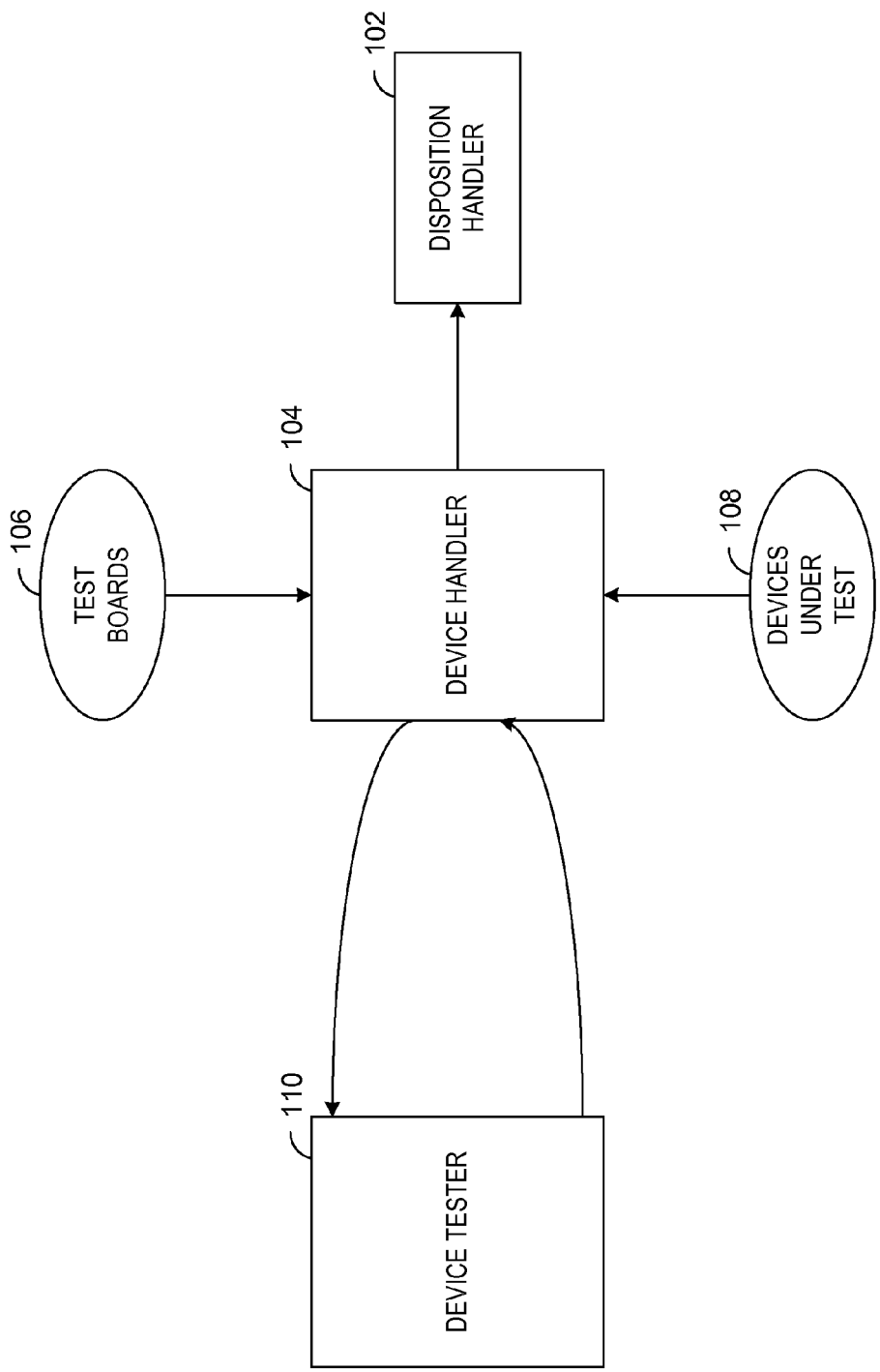
FIG. 1 illustrates a block diagram of an automated test system in accordance with one embodiment of the present invention.

Generally, various embodiments of the present invention are applied to the field of integrated circuits (ICs) of which programmable logic devices (PLDs) are a subset. In particular, a method and apparatus is provided to facilitate testing of ICs using an interposer that is to be utilized in conjunction with an automated test equipment (ATE) system, which includes a device handler and a device tester. The interposer may be utilized to convert overall device under test (DUT) board pitches to accommodate various device handler pitch orientations, or conversely, the interposer may be utilized in conjunction with a single DUT board to convert the footprint of the DUT board to accommodate multiple device package footprints. The interposer may also be used to convert a DUT board exhibiting a first single/multi-site orientation to a converted DUT board that exhibits a second single/multi-site orientation.

In accordance with one embodiment of the present invention, the interposer may be utilized to convert the pitch orientation of a single, or a multiple, site DUT board for use with a device handler that is not compatible with the particular pitch orientation of the DUT board. For example, an exemplary DUT board may provide multiple test sites, e.g., 8 test sites having an 80 mm×75 mm pitch orientation, but the corresponding device handler may only be able to accommodate a pitch orientation of, e.g., 63.5 mm×63.5 mm. In such an instance, the interposer interoperates with the DUT board to convert the DUT board's 80 mm×75 mm pitch orientation to a 63.5 mm×63.5 mm pitch orientation that is compatible with the device handler. As such, a previously incompatible DUT board is made to be compatible with the device handler through use of the interposer by converting the pitch dimensions of the DUT board to those that are accommodated by the device handler.

In accordance with an alternate embodiment of the present invention, the interposer may instead be utilized to allow a single DUT board to be used in conjunction with multiple package types. That is to say, in other words, that a DUT board that exhibits, e.g., single/multiple ball grid array test sites, may be converted to a DUT board that exhibits, e.g., single/multiple quad flat package test sites. Alternately, the interposer may be used to convert the motherboard from a single site motherboard to a multiple site motherboard, or conversely, from a multiple site motherboard to a single site motherboard.

The interposer may be composed of an elastomeric material, in accordance with one embodiment of the present invention, whereby multiple conductive columns are distributed throughout the elastomeric material. In particular, ball wire conductive columns may be incorporated within the elastomeric material to form connections that are electrically conductive between first and second surfaces of the interposer.

In an alternate embodiment, the interposer may instead be composed of a Pogo® pin array, whereby the geographic orientation of pin connections on a first surface of the array may be converted to a different geographic orientation of pin connections on a second surface of the array. Interconnections between each pin connection on each surface may then be mechanically arranged within the array as required by the particular application to accommodate the requisite conductivity between the two surfaces of the array. It is understood that other interposer embodiments exist, such as printed circuit boards (PCBs), to provide alternate conversion means to adapt the DUT board for use with incompatible device handlers and/or device package types.

When used as a device handler interposer, the conductive pads on a first surface of the interposer may be designed to match single/multi-site pitch dimensions of the DUT board, while a second surface of the interposer incorporates conductive pads that conform to the pitch orientation of the device handler. When used as a device package interposer, on the other hand, a first surface of the interposer may be designed to match the device package footprint that is exhibited by the DUT board, while a second surface of the interposer incorporates conductive pads that conform to the device package footprint of the actual device(s) under test. Alternately, the interposer may be utilized to convert a pin count exhibited by the one or more test sites on the DUT board to a pin count exhibited by the actual devices that are to be tested. In any case, conductive columns distributed throughout the interposer interconnect the conductive pads on both surfaces of the interposer to complete the conversion(s).

Turning to FIG. 1, a block diagram of an automated test system in accordance with one embodiment of the present invention is illustrated, whereby mass production electrical testing of integrated circuits (ICs), such as programmable logic devices (PLDs), may be executed. Device handler 104 represents an electro-mechanical device that presents the device under test (DUT) to the test site of device tester 110. Once the DUT is secured within the test site, device tester 110 automatically characterizes the electrical characteristics and performance of devices under test 108 in accordance with one or more automated test scenarios.

In general, the automated test system of FIG. 1 is a microprocessor-based system that controls boards/modules within device tester 110 that supply electrical excitation to devices under test 108. Device tester 110 also contains boards/modules that measure the electrical characteristics of devices under test 108 in response to the electrical excitations. Test boards 106 may be populated by device handler 104 in order to accommodate the testing of one or more devices under test 108 by placing one or more devices under test 108 into one or more test sites that are allocated within test boards 106. Once test boards 106 are populated with devices under test 108 to create the so-called "DUT boards", they are then transferred to the test site of device tester 110 for testing. It is noted that device handler 104 may utilize any number of population techniques, such as gravity, electro-mechanical, or pick-and-place to bring the devices under test 108 into the one or more test sites allocated within test boards 106.

The characterization process implemented by device tester 110 is controlled by a microprocessor-based system that executes test sequences defined by a high-level programming language such as C and/or C++. Each test sequence characterizes the DUTs by instructing a first set of test probes (not shown) within device tester 110 to apply electrical stimuli to the DUTs and then instructing a second set of test probes (not shown) to characterize the DUT's response to the electrical stimuli.

The characterization results and DUTs are returned to device handler 104, where the DUTs are then categorized as pass/fail devices in response to the DUT's characterization results. The DUTs are then transferred by device handler 104 to disposition handler 102 for final disposition, where disposition handler 102 parses each DUT into pass/fail bins (not shown) for disposition of the DUT in response to the characterization results.

Figure 2A:
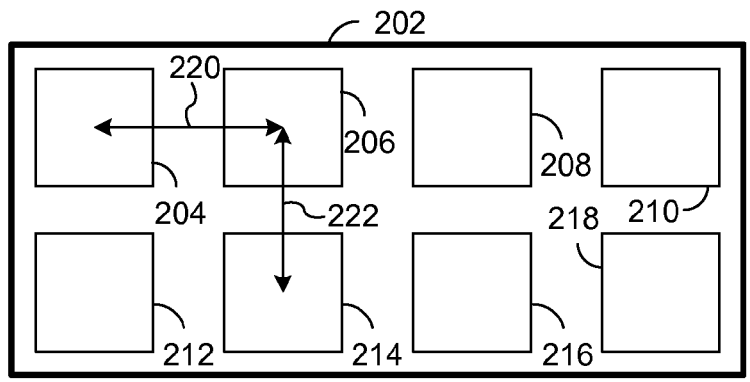
FIGS. 2A-2C illustrate aspects of a pitch orientation interposer of the automated test system of FIG. 1 in accordance with an embodiment of the present invention.
Figure 2B:
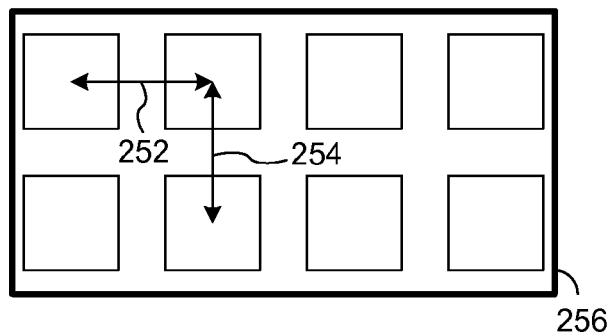
Figure 2C:
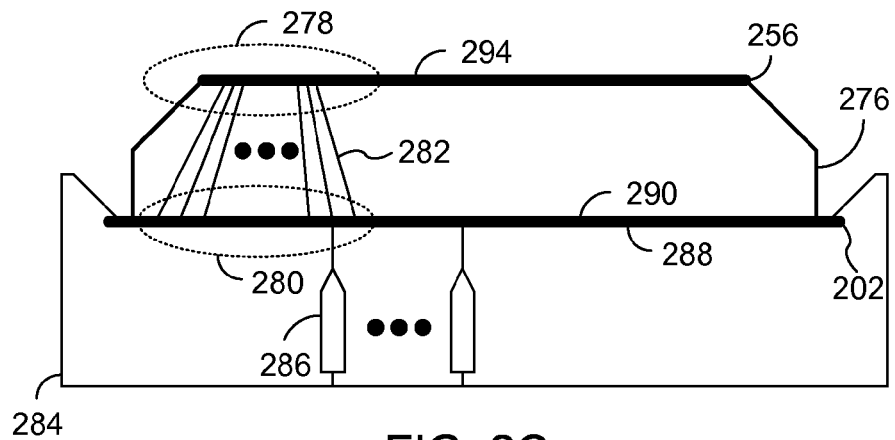

Turning to FIGS. 2A-2C, interposer 276 is exemplified as a pitch orientation interposer, whereby a first pitch orientation, i.e., 220/222, exhibited by DUT board 202 is converted to a second pitch orientation, i.e., 252/254, by pitch orientation interposer 276 that is compatible with the pitch orientation accommodated by device handler 104 of FIG. 1. That is to say, in other words, that device handler 104 may only accommodate pitch orientation 252/254, which in one embodiment, is a smaller pitch orientation with respect to pitch orientation 220/222 that is exhibited by DUT board 202. Thus, pitch orientation interposer 276 is utilized to convert pitch orientation 220/222 to pitch orientation 252/254 so as to facilitate compatibility between device handler 104 and DUT board 202 in view of the incompatibilities between pitch orientation 220/222 and pitch orientation 252/254 as shown.

Turning back to FIG. 1, device handler 104 includes handler interface 284 that comprises the mechanical assembly that is required to allow test probes 286 of device tester 110 to make electrical contact with surface 288 of DUT board 202 as illustrated. Surface 288 of DUT board 202, for example, contains input/output (I/O) pads that transfer electrical stimuli and electrical responses between surfaces 288 and 290 of DUT board 202.

Surface 290 of DUT board 202 may contain a number of test sites, e.g., 204-218, having pitch orientation 220/222 as illustrated, which in the absence of interposer 276, allow ICs to be placed onto surface 290 of DUT board 202 by device handler 104. However, pitch orientation interposer 276 is instead placed on surface 290 of DUT board 202 so as to convert pitch orientation 220/222 of DUT board 202 to pitch orientation 252/254 that is accommodated by device handler 104.

In one embodiment, DUT board 202 may provide multiple test sites, e.g., 8 test sites 204-218, having, e.g., an 80 mm×75 mm pitch orientation, but the corresponding pitch orientation of device handler 104 is, e.g., 63.5 mm×63.5 mm. In such an instance, pitch orientation interposer 276 interoperates with DUT board 202 to convert DUT board 202's 80 mm×75 mm pitch orientation to a 63.5 mm×63.5 mm pitch orientation that is compatible with device handler 104. As such, incompatible DUT board 202 is made to be compatible with device handler 104 through use of pitch orientation interposer 276 by converting the pitch orientation of DUT board 202 to a pitch orientation that is compatible with device handler 104. That is to say, in other words, that device handler 104 may populate surface 294 of pitch orientation interposer 276 with devices under test 108, since surface 294 of pitch orientation interposer 276 exhibits the correct device handler opening 256 and the correct pitch orientation 252/254 that is compatible with device handler 104.

As discussed above, pitch orientation interposer 276 may be composed of an elastomeric material, wherein multiple conductive columns 282 are distributed throughout the elastomeric material to electrically connect conductive pads 280 of a first surface of pitch orientation interposer 276 to conductive pads 278 of a second surface of pitch orientation interposer 276. In particular, ball wire conductive columns may be incorporated within the elastomeric material to form connections that are electrically conductive between conductive pads of the first and second surfaces of the interposer.

A first surface of pitch orientation interposer 276, for example, electrically contacts the conductive pads of surface 290 of DUT board 202 while multiple conductive columns 282 provide electrical connectivity between corresponding conductive pads 280 and 278 of pitch orientation interposer 276. It is noted that conductive columns 282 may be arranged in virtually any configuration so as to facilitate any conductivity correspondence between conductive pads 280 and 278 of pitch orientation interposer 276.

As discussed above, pitch orientation interposer 276 may instead be implemented using a Pogo® pin array, whereby the geographic orientation of pin connections on a first surface of the array may be converted to a same or different geographic orientation of pin connections on a second surface of the array. Interconnections between each pin connection on each surface may then be mechanically arranged within the array as required by the conductivity correspondence required between the first and second surfaces of pitch orientation interposer 276. It is noted that other configurations, such as a PCB, may be used to implement pitch orientation interposer 276.

It can be seen that other embodiments of pitch orientation interposer 276 may be utilized to accommodate other pitch orientation conversions. For example, device handler 104 may only accommodate a pitch orientation that is a larger pitch orientation with respect to the pitch orientation that is exhibited by a particular DUT board. In such an instance, the pitch orientation interposer may be utilized to convert the smaller pitch orientation of the DUT board to the larger pitch orientation of the device handler so as to facilitate compatibility between device handler 104 and the DUT board.

Figure 3A:
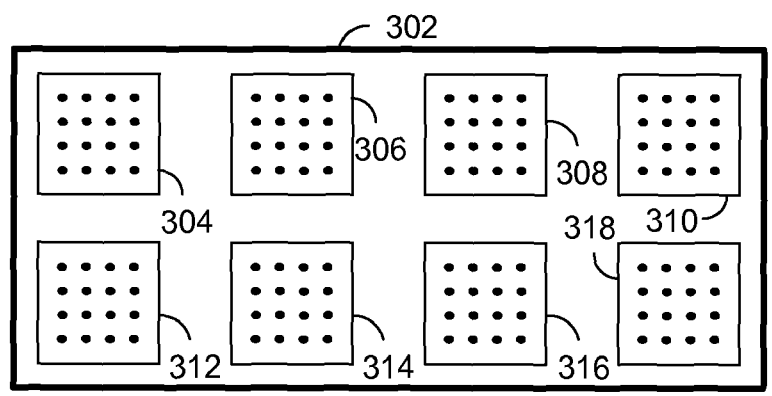
FIGS. 3A-3C illustrate aspects of a device package interposer of the automated test system of FIG. 1 in accordance with an alternate embodiment of the present invention.
Figure 3B:
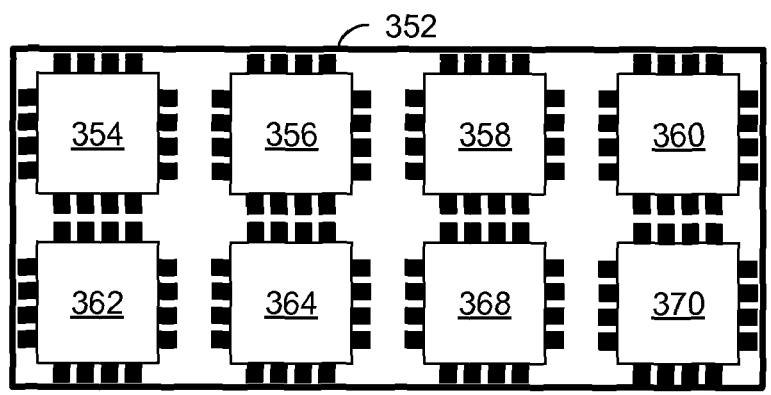
Figure 3C:
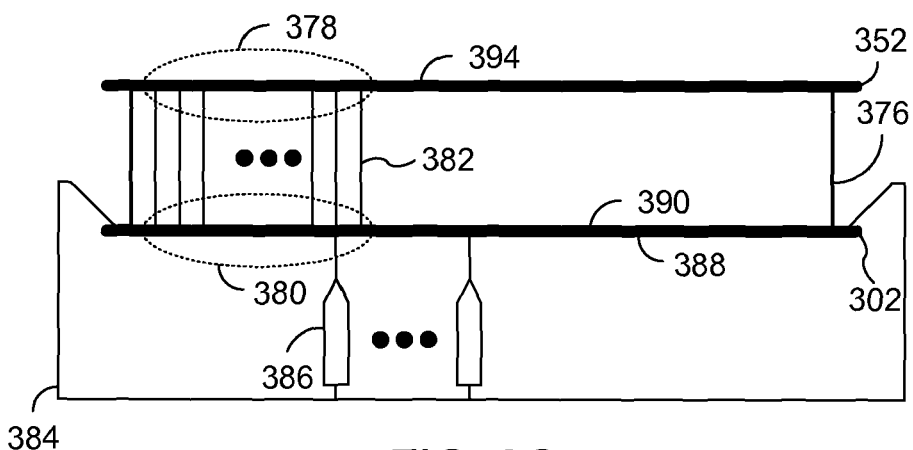

Turning to FIGS. 3A-3C, an alternate embodiment of an interposer is illustrated, whereby the interposer may instead be utilized as a device package interposer to allow a single DUT board to be used in conjunction with multiple package types. That is to say, in other words, that DUT board 302 may exhibit, e.g., multiple ball grid array test sites 304-318, and may be converted to DUT board 352 that exhibits, e.g., multiple quad flat package test sites 354-370, through the use of device package interposer 376. Thus, device package interposer 376 is utilized to convert ball grid array test sites 304-318 to quad flat package test sites 354-370 even though device handler 104 may be configured to place either quad flat packages or ball grid array packages onto a particular DUT board. In such an instance, the package type of DUT board 302 is converted to match the package type of the DUTs that are to be actually tested.

As discussed above, device handler 104 includes handler interface 384 that comprises the mechanical assembly that is required to allow test probes 386 of device tester 110 to make electrical contact with surface 388 of DUT board 302 as illustrated. Surface 388 of DUT board 302, for example, contains input/output (I/O) pads that transfer electrical stimuli and electrical responses between surfaces 388 and 390 of DUT board 302.

Surface 390 of DUT board 302 may contain a number of test sites, e.g., 304-318, having ball grid array pads as illustrated, which in the absence of interposer 376, allows ball grid array packages to be placed onto surface 390 of DUT board 302. However, device package interposer 376 is instead placed on surface 390 of DUT board 302 so as to convert the ball grid array pads of DUT board 302 to a quad flat package arrangement of pads. As such, incompatible DUT board 302 is made to be compatible with the actual DUTs through use of device package interposer 376 by converting the ball grid array test sites of DUT board 302 to a quad flat package arrangement of test sites that are compatible with the actual DUTs that are to be tested.

As discussed above, device package interposer 376 may be composed of an elastomeric material, wherein multiple conductive columns 382 are distributed throughout the elastomeric material to electrically connect conductive pads 380 of a first surface of device package interposer 376 to conductive pads 378 of a second surface of device package interposer 376. In particular, ball wire conductive columns may be incorporated within the elastomeric material to form connections that are electrically conductive between conductive pads of the first and second surfaces of the interposer.

A first surface of device package interposer 376, for example, electrically contacts the conductive pads of surface 390 of DUT board 302 while multiple conductive columns 382 provide electrical connectivity between corresponding conductive pads 380 and 378 of device package interposer 376. It is noted that conductive columns 382 may be arranged in virtually any configuration so as to facilitate any conductivity correspondence between conductive pads 380 and 378 of device package interposer 376.

As discussed above, device package interposer 376 may instead be implemented using a Pogo® pin array, whereby the geographic orientation of pin connections on a first surface of the array may be converted to a same or different geographic orientation of pin connections on a second surface of the array. Interconnections between each pin connection on each surface may then be mechanically arranged within the array as required by the conductivity correspondence required between the first and second surfaces of device package interposer 376. It is noted that other configurations, such as a printed circuit board (PCB), may be used to implement device package interposer 376.

It can be seen that other embodiments of device package interposer 376 may be utilized to accommodate other device type conversions. Examples of other package type conversions that may be facilitated by device package interposer 376 include pin grid array, chip scale, dual in-line, and land grid array package types to name only a few. Thus, device package interposer 376 may be utilized within the automated test system as discussed above in relation to FIG. 1, so as to facilitate testing of various package types that are otherwise incompatible with DUT board 302.

Figure 4A:
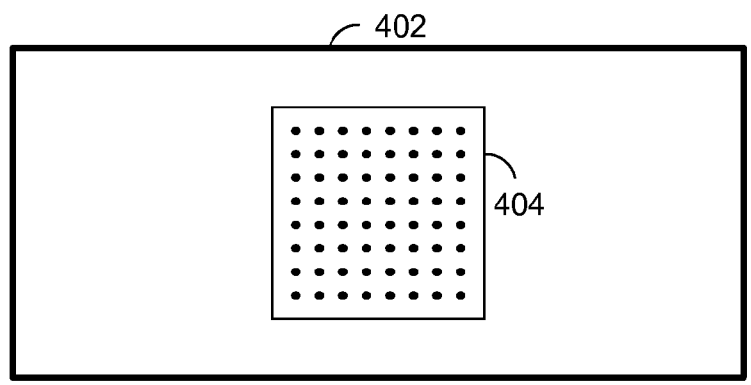
FIGS. 4A-4C illustrate aspects of a test site interposer of the automated test system of FIG. 1 in accordance with an alternate embodiment of the present invention.
Figure 4B:
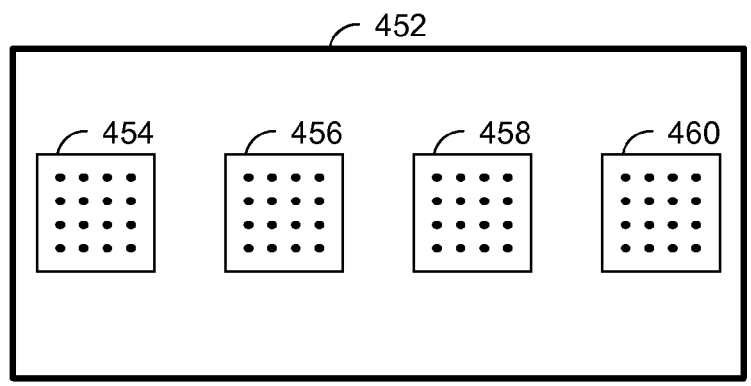
Figure 4C:
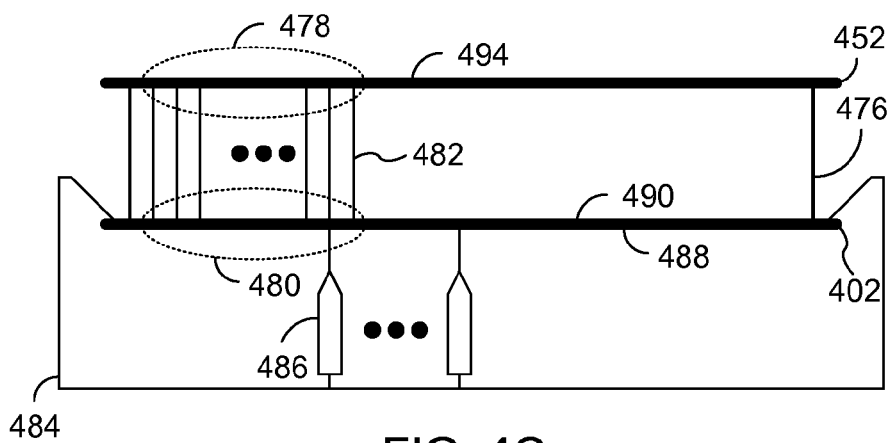

Turning to FIGS. 4A-4C, an alternate embodiment of an interposer is illustrated, whereby the interposer may instead be utilized as a test site interposer to allow a single DUT board offering single, or multiple test sites to be used in conjunction with a device handler that is compatible with only multiple or single test site configurations, respectively. That is to say, in other words, that DUT board 402 may exhibit, e.g., a single ball grid array test site 404, and may be converted to DUT board 452 that exhibits, e.g., multiple ball grid array test sites 454-460, through the use of test site interposer 476. Thus, test site interposer 476 is utilized to convert, e.g., a single ball grid array test site 404, to, e.g., multiple ball grid array test sites 454-460, so as to facilitate compatibility between device handler 104 and DUT board 402 despite the fact that device handler 104 may only be compatible with, e.g., 4-site DUT board 452.

As discussed above, device handler 104 includes handler interface 484 that comprises the mechanical assembly that is required to allow test probes 486 of device tester 110 to make electrical contact with surface 488 of DUT board 402 as illustrated. Surface 488 of DUT board 402, for example, contains input/output (I/O) pads that transfer electrical stimuli and electrical responses between surfaces 488 and 490 of DUT board 402.

Surface 490 of DUT board 402 may contain a single test site, e.g., 404, having ball grid array pads as illustrated, which in the absence of interposer 476, allows a single ball grid array package to be placed onto surface 490 of DUT board 402 by device handler 104. However, test site interposer 476 is instead placed on surface 490 of DUT board 402 so as to convert the ball grid array pads of single-site DUT board 402 to the ball grid array pads of multi-site DUT board 452. As such, incompatible DUT board 402 is made to be compatible with device handler 104 through use of test site interposer 476 by converting the ball grid array test site of DUT board 402 to multiple ball grid array test sites that are compatible with device handler 104.

That is to say, in other words, that device handler 104 may populate surface 494 of test site interposer 476 with multiple ball grid array devices under test 108, since surface 494 of test site interposer 476 exhibits a multi-site, ball grid arrangement that is compatible with device handler 104. In such an instance, multiple ball grid array packages may be tested despite the fact that DUT board 402 is configured for a single ball grid array package. It is understood that test site interposer 476 may also be used to convert between multiple test site DUT boards to single test site DUT boards, while also converting pin types as necessary, e.g., converting a multiple ball grid array test site DUT board to a single quad flat package test site DUT board.

As discussed above, test site interposer 476 may be composed of an elastomeric material, wherein multiple conductive columns 482 are distributed throughout the elastomeric material to electrically connect conductive pads 480 of a first surface of test site interposer 476 to conductive pads 478 of a second surface of test site interposer 476. In particular, ball wire conductive columns may be incorporated within the elastomeric material to form connections that are electrically conductive between conductive pads of the first and second surfaces of the interposer.

A first surface of test site interposer 476, for example, electrically contacts the conductive pads of surface 490 of DUT board 402 while multiple conductive columns 482 provide electrical connectivity between corresponding conductive pads 480 and 478 of test site interposer 476. It is noted that conductive columns 482 may be arranged in virtually any configuration so as to facilitate any conductivity correspondence between conductive pads 480 and 478 of test site interposer 476.

As discussed above, test site interposer 476 may instead be implemented using a Pogo® pin array, whereby the geographic orientation of pin connections on a first surface of the array may be converted to a same or different geographic orientation of pin connections on a second surface of the array. Interconnections between each pin connection on each surface may then be mechanically arranged within the array as required by the conductivity correspondence required between the first and second surfaces of test site interposer 476. It is noted that other configurations, such as a PCB, may be used to implement test site interposer 476.

It can be seen that other embodiments of test site interposer 476 may be utilized to accommodate other device handler conversions. For example, device handler 104 may only accommodate a single test site, while the corresponding DUT board only provides for multi-site testing. In such an instance, the test site interposer may be utilized to convert the multiple test sites provided by the DUT board to a single test site that is compatible with the device handler.

Figure 5:
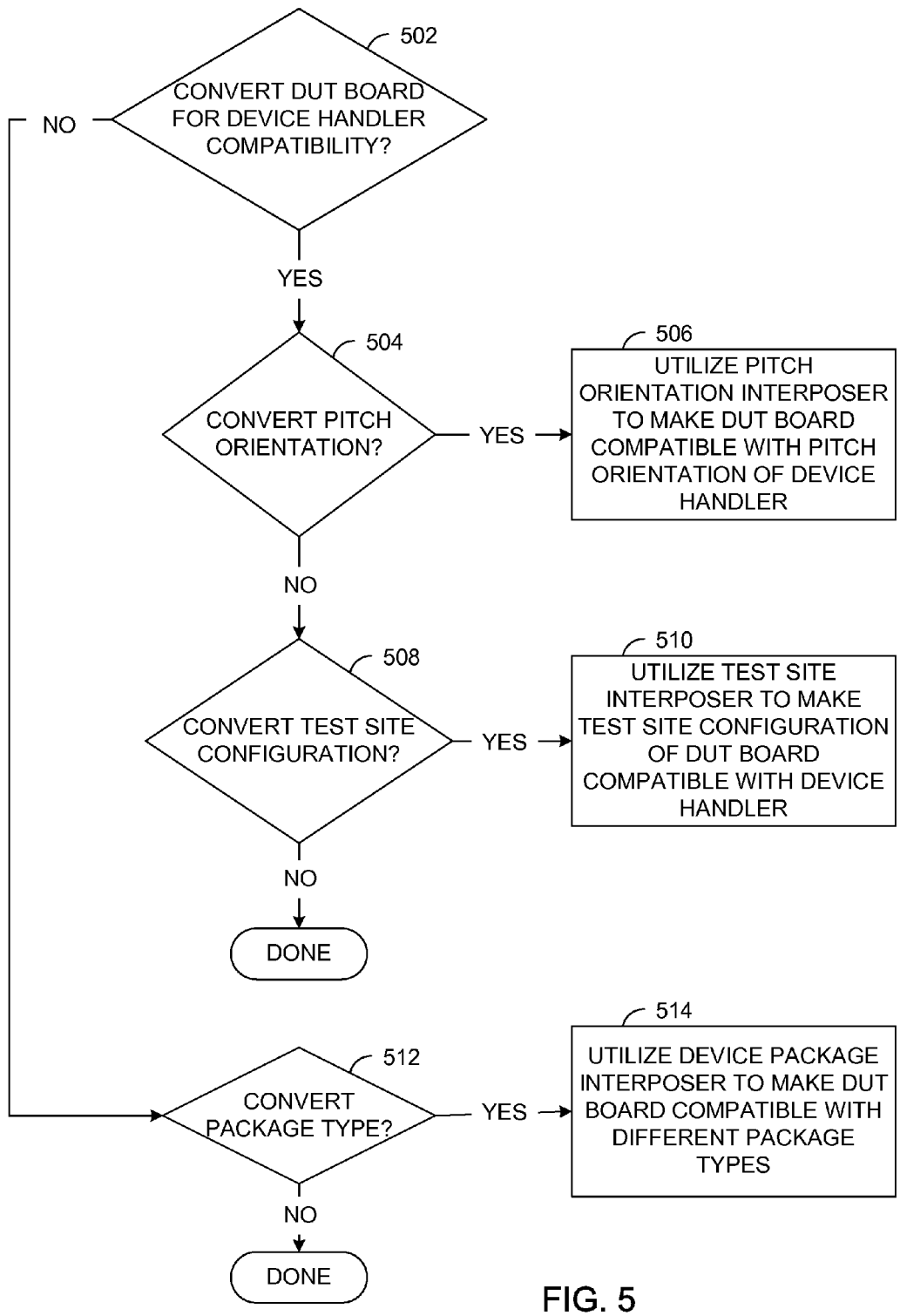
FIG. 5 illustrates a flow diagram of a method of utilizing an interposer to convert the capabilities of a particular device under test (DUT) board to match the capabilities of a device handler or to be compatible with a plurality of package types in accordance with various embodiments of the present invention.

Turning to FIG. 5, a flow diagram of a method of utilizing an interposer to convert the capabilities of a particular DUT board and a particular device handler is illustrated in accordance with various embodiments of the present invention. In step 502, a determination is made as to whether an interposer is to be utilized to convert characteristics of a DUT board to accommodate characteristics of a device handler that is being utilized within the automated test system. If not, the interposer may be used to convert a DUT board from one package type to another.

If an interposer is to be used to convert the capabilities of a DUT board to match the capabilities of a device handler, then in step 504, a determination is made as to whether a pitch orientation of the DUT board is to be converted to a pitch orientation that is compatible with the particular device handler utilized by the automated test system. In particular, device handler 104 of FIG. 1 may only accommodate a single pitch orientation, e.g., pitch orientation 252/254 of FIG. 2B, which in one embodiment, is a smaller pitch orientation with respect to pitch orientation 220/222 that is exhibited by DUT board 202 of FIG. 2A. Thus, pitch orientation interposer 276 is utilized in step 506 to convert pitch orientation 220/222 to pitch orientation 252/254 so as to facilitate compatibility between device handler 104 and DUT board 202 in view of the incompatibilities between pitch orientation 220/222 and pitch orientation 252/254 as illustrated in FIGS. 2A and 2B.

If pitch orientation is not to be converted, then in step 508, a determination is made as to whether the test site configuration of a particular DUT board is to be converted to a test site configuration that is compatible with the particular device handler utilized by the automated test system. In particular, a test site interposer may be utilized to allow a single DUT board offering single, or multiple test sites to be used in conjunction with a device handler that is compatible with only multiple or single test site configurations, respectively. That is to say, in other words, that DUT board 402 of FIG. 4A may exhibit, e.g., a single ball grid array test site 404, and may be converted to DUT board 452 of FIG. 4B that exhibits, e.g., multiple ball grid array test sites 454-460, through the use of test site interposer 476. Thus, test site interposer 476 is utilized in step 510 to convert, e.g., a single ball grid array test site 404, to, e.g., multiple ball grid array test sites 454-460, so as to facilitate compatibility between device handler 104 and DUT board 402 despite the fact that device handler 104 may only be compatible with, e.g., 4-site DUT board 452.

If instead, an interposer is to be used to convert a DUT board from one package type to another, then in step 512, a determination is made as to whether a single DUT board is to be used in conjunction with multiple package types. In particular, DUT board 302 of FIG. 3A may exhibit, e.g., multiple ball grid array test sites 304-318, while multiple quad flat packages are in need of testing. In such an instance, device package interposer 376 is utilized in step 514 to convert ball grid array test sites 304-318 of FIG. 3A to quad flat package test sites 354-370 of FIG. 3B.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of utilizing an interposer in an automated test system, the method comprising:
    determining whether a configuration of conductive elements of a device under test board is to be converted to match a configuration of conductive elements of a device handler of the automated test system;
    engaging the interposer between the device under test board and an interface of the device handler in response to an affirmative determination;
    utilizing a first surface of the interposer to match the configuration of conductive elements of the device handler; and
    utilizing a second surface of the interposer to match the configuration of conductive elements of the device under test board, wherein the configuration of conductive elements of the device under test board is different than the configuration of conductive elements of the device handler and conductive columns and corresponding conductive pads of the interposer adapt the device under test board for use with the device handler within the automated test system.

2. The method of claim 1, wherein determining whether a configuration of conductive elements of a device under test board is to be converted to match a configuration of conductive elements of a device handler of the automated test system comprises determining whether to convert a pitch orientation of the device under test board to match a pitch orientation of the device handler.

3. The method of claim 2, wherein the pitch orientation of the device handler is smaller than the pitch orientation of the device under test board.

4. The method of claim 2, wherein the pitch orientation of the device handler is larger than the pitch orientation of the device under test board.

5. The method of claim 1, wherein determining whether a configuration of conductive elements of a device under test board is to be converted to match a configuration of conductive elements of a device handler of the automated test system comprises determining whether to convert a test site configuration of the device under test board to match a test site configuration of the device handler.

6. The method of claim 5, wherein utilizing a first surface of the interposer and utilizing a second surface of the interposer comprises matching a single test site configuration of the device handler to a multiple test site configuration of the device under test board.

7. The method of claim 5, wherein utilizing a first surface of the interposer and utilizing a second surface of the interposer comprises matching a multiple test site configuration of the device handler to a single test site configuration of the device under test board.

8. The method of claim 1, wherein engaging the interposer between the device under test board and an interface of the device handler comprises utilizing an interposer composed of an elastomeric material, wherein ball wire conductive columns are distributed throughout the elastomeric material.

9. The method of claim 1, wherein engaging the interposer between the device under test board and an interface of the device handler comprises utilizing an interposer composed of a pin array, wherein the conductive columns are mechanically arranged throughout the pin array.

10. A method of utilizing an interposer in an automated test system, the method comprising:
    determining whether a configuration of conductive elements of a device under test board is to be converted to match a configuration of conductive elements of devices under test;
    engaging the interposer to the device under test board in response to an affirmative determination;
    utilizing a first surface of the interposer to match the configuration of conductive elements of the device under test board; and
    utilizing a second surface of the interposer to match the configuration of conductive elements of the devices under test, wherein the configuration of conductive elements of the device under test board is different than the configuration of conductive elements of the devices under test and conductive columns and corresponding conductive pads of the interposer adapt the device under test board for use with the devices under test.

11. The method of claim 10, wherein determining whether a configuration of conductive elements of a device under test board is to be converted to match a configuration of conductive elements of devices under test comprises determining whether to convert a package type of the device under test board to match a package type of the devices under test.

12. The method of claim 11, wherein the package type of the device under test board comprises one of a quad flat package, ball grid array package, pin grid array package, chip scale package, dual in-line package, and land grid array package.

13. The method of claim 12, wherein the package type of the devices under test comprises one of a quad flat package, ball grid array package, pin grid array package, chip scale package, dual in-line package, and land grid array package.

14. The method of claim 10, wherein engaging the interposer to the device under test board comprises utilizing an interposer composed of an elastomeric material, wherein ball wire conductive columns are distributed throughout the elastomeric material.

15. The method of claim 10, wherein engaging the interposer to the device under test board comprises utilizing an interposer composed of a pin array, wherein the conductive columns are mechanically arranged throughout the pin array.

16. An automated test system, comprising:
a device tester adapted to automatically characterize electrical characteristics of devices under test;
a device handler adapted to present the devices under test to the device tester for automatic characterization, the device handler including an interface adapted to accept a device under test board; and
an interposer coupled to the interface of the device handler, the interposer being adapted to convert a configuration of conductive elements of the device under test board to be compatible with a configuration of conductive elements of the device handler, wherein the configuration of conductive elements of the device under test board is different than the configuration of conductive elements of the device handler.

17. The automated test system of claim 16, wherein the interposer is adapted to convert a pitch orientation of the device under test board to match a pitch orientation of the device handler.

18. The automated test system of claim 16, wherein the interposer is adapted to convert a test site configuration of the device under test board to match a test site configuration of the device handler.

19. The automated test system of claim 16, wherein the interposer comprises an elastomeric material having ball wire conductive columns distributed throughout the elastomeric material.

20. The automated test system of claim 16, wherein the interposer comprises a pin array having conductive columns mechanically arranged throughout the pin array.

* * * * *